United States Patent [19]

Grafius

[11] Patent Number: 4,462,508
[45] Date of Patent: Jul. 31, 1984

[54] APPARATUS FOR ALIGNING AND FEEDING ELONGATED OBJECTS

[75] Inventor: Gerald R. Grafius, Erie, Pa.

[73] Assignee: Swanson Systems, Inc., Erie, Pa.

[21] Appl. No.: 288,038

[22] Filed: Jul. 29, 1981

[51] Int. Cl.³ .............................................. B65G 47/14
[52] U.S. Cl. .................................... 221/201; 198/382; 198/396; 221/160; 209/920; 209/940
[58] Field of Search ............... 209/539, 629, 707, 920, 209/921, 925, 940; 198/382, 391, 396, 757; 221/172, 200, 201, 311, 159, 160, 167, 168, 225; 29/759; 366/108

[56] References Cited

U.S. PATENT DOCUMENTS

| | | | |
|---|---|---|---|
| 1,733,359 | 10/1929 | Phillips | 198/382 |
| 2,661,833 | 12/1953 | Spurlin | 198/757 |
| 2,725,971 | 12/1955 | Clark-Riede | 198/391 |
| 2,771,992 | 11/1956 | Arting-Stall et al. | 209/574 |
| 2,887,209 | 5/1959 | Merchant | 198/19 |
| 2,962,846 | 12/1960 | Marindin | 53/67 |
| 2,990,940 | 7/1961 | Merchant | 198/137 |
| 3,065,530 | 11/1962 | Merchant et al. | 29/428 |
| 3,114,448 | 12/1963 | Boris | 198/391 |
| 3,150,762 | 9/1964 | Tricinci | 198/391 X |
| 3,231,968 | 2/1966 | Swanson | 29/208 |
| 3,414,111 | 12/1968 | Ernest | 198/391 |
| 3,810,540 | 5/1974 | Georges | 209/573 X |
| 4,006,812 | 2/1977 | Everett et al. | 198/396 X |
| 4,138,009 | 2/1979 | Strong | 198/396 |
| 4,146,123 | 3/1979 | Cottrell | 198/382 |

OTHER PUBLICATIONS

FMC Product Description Entitled "Syntron Parts Handling Vibrating Base Units VPF Series".
Swanson Product Pamphlet Entitled "Swanson Vibratory Parts Feeders".

Primary Examiner—Robert B. Reeves
Assistant Examiner—Edward M. Wacyra
Attorney, Agent, or Firm—Willian Brinks Olds Hofer Gilson & Lione Ltd.

[57] ABSTRACT

An apparatus for aligning and feeding the elongated objects comprising a vibrating bowl for receiving elongated objects, the bowl having a base portion, a side wall, and a ramp spiralling around the inner perimeter of the side wall such that the elongated objects are conveyed from the bottom end of the ramp adjacent the base portion along the upper surface of the ramp to the top end of the ramp, first and second sorting stations positioned along the ramp within the bowl for removing bent objects and limiting the number of elongated objects conveying along the ramp in side-by-side relationship and an escape chute for feeding the elongated objects sequentially from the top end of the ramp. The bent objects are removed and the number of objects passing along the ramp reduced by the first and second sorting station having narrowed ramp widths and associated inclines. The sequential feeding at the top end of the ramp is provided by the escape chute mounted adjacent the bowl for receiving the elongated objects from the bowl and guiding the objects in a direction perpendicular to the axis of each of the objects. A pick-up apparatus positioned adjacent the escape chute removes the elongated objects sequentially from the escape chute.

19 Claims, 7 Drawing Figures

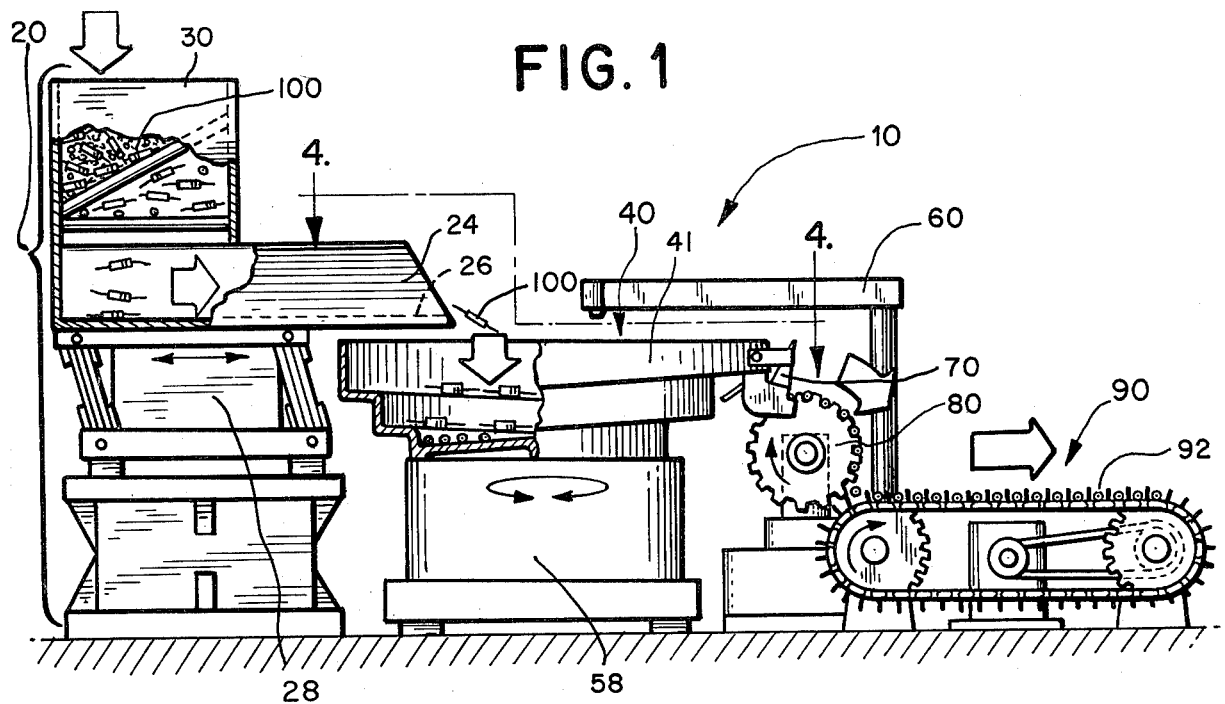
FIG. 1
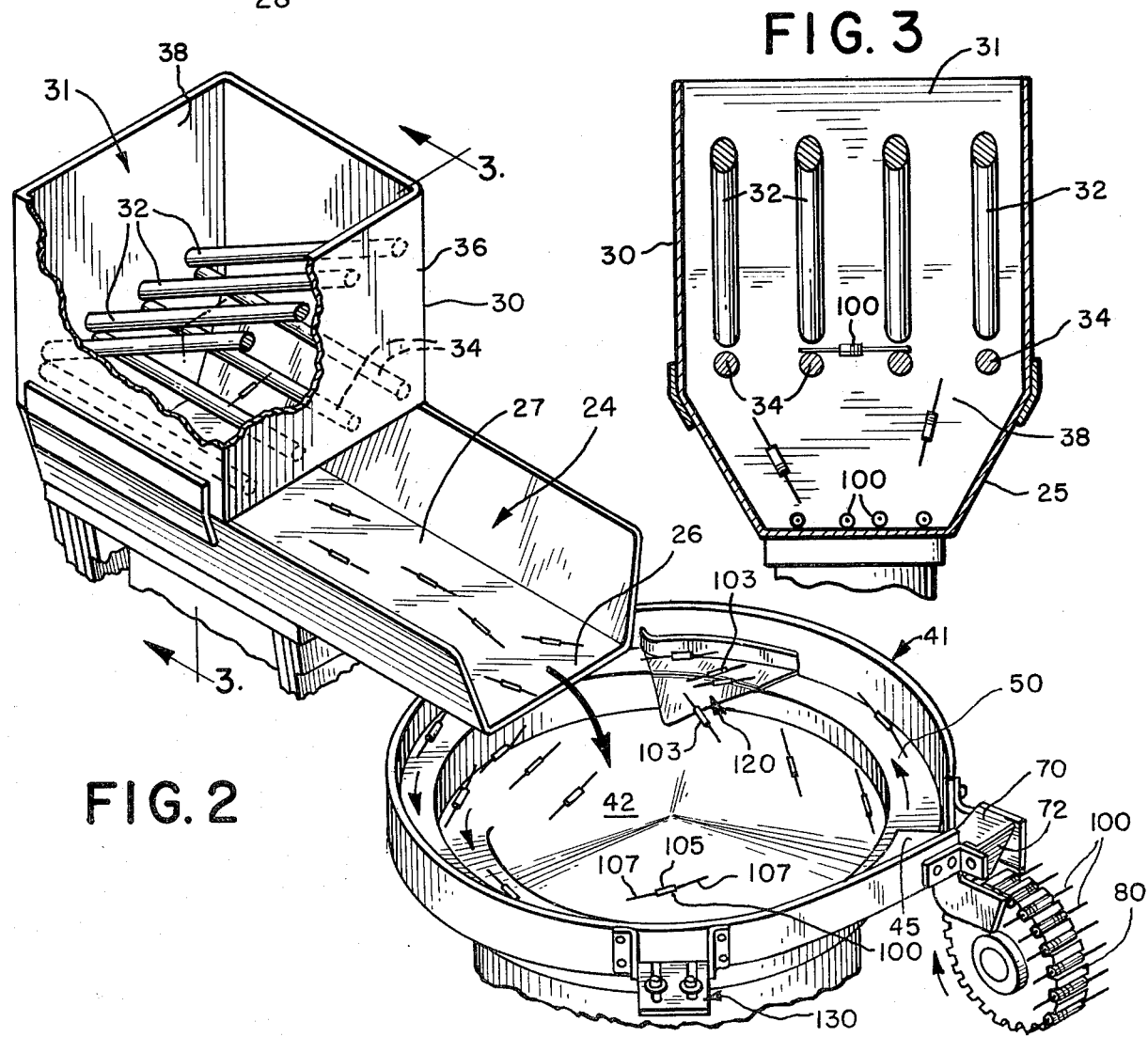
FIG. 2
FIG. 3

APPARATUS FOR ALIGNING AND FEEDING ELONGATED OBJECTS

BACKGROUND AND SUMMARY OF THE INVENTION

This invention relates to parts-handling apparatus for aligning and feeding elongated objects to be tested or to be conveyed to an assembly machine for assembly on printed circuit boards.

Assembly machines are used to automatically assemble an article from its component parts. Injector razors, spark plugs, and light bulbs are but a few of the types of articles typically assembled by assembly machines. Sophisticated electronic devices containing electronic components such as diodes, resistors, capacitors and the like may also be assembled by assembly machines. The assembly machines may be of the "rotary" type, such as disclosed in U.S. Pat. Nos. 3,065,530 and 3,231,968, assigned to the assignee of the present invention, or of the "in-line" type, such as disclosed in U.S. Pat. Nos. 2,887,209 and 2,990,940, also assigned to the assignee of the present invention.

Electronic components such as diodes, resistors, and capacitors may be of the type having an elongated cylindrical body with a wire lead at either end of the body. A typical banded resistor, for instance, has this elongated configuration. When large numbers, of these electronic components are supplied for assembly, such as into printed circuit boards, they may be packaged in bulk so that the wire leads of the components can become bent or tangled. While such bulk quantities of these electronic components can be manually sorted, aligned, and sequentially fed, it is often necessary and desirable to accomplish sorting, alignment, and feeding by machine. When these components are sequentially fed to a conveying apparatus, they can then be attached in a continuous row on tape strips for storage for later use, or they can be fed directly to machines for further assembly.

Prior attempts to sort, align, and sequentially feed elongated objects such as electronic components by machine have not always been successful in accommodating parts with bent leads. It has been found that, for instance, elongated objects having a central cylindrical body and a wire lead at each end can be used by automatic assembly machines for certain applications even though the leads may be bent at angles as great as 60° from the axis of the cylindrical body. However, known apparatus for accomplishing sorting, alignment, and feeding of such objects have generally not been able to feed parts having leads bent at an angle so great that they extend above the axis of the body a distance greater than the body's radius. For instance, although vibratory bowls and feeders have been used to attempt to feed such elongated objects, known apparatus have not been successful in arranging such elongated objects transversely for sequential feeding so that the cylindrical walls of the components are adjacent one another, when the elongated objects have leads bent a distance greater than the radius of the cylindrical body.

The disadvantages in the feeding obtained by the machines of the prior art have increased the amount of manual sorting required for sequential feeding of such elongated objects. Bent leads on the objects tend to jam the feeders of the prior art, which may be in the form of zig-zag gravity feeders, requiring manual removal from the feeder. If bent leads are rejected by the known apparatus, such as into the bottom of the vibratory bowl, they must be manually removed. High feed rates are desirable in such machines, but known apparatus have typically been limited to rates of about 60 to 70 per minute, and manual removal of objects with bent leads decreases the effective feed rate even further.

Accordingly, the present invention overcomes disadvantages of the known apparatus by providing an apparatus and method that can accommodate and feed elongated objects having bent leads, at least up to about 60°. The apparatus of the present invention is less susceptible to jams than known apparatus, and also provides mechanical disentanglement of the elongated objects so that it can better accommodate elongated parts fed in bulk. The apparatus of the present invention also has a feed rate of at least about 200 parts per minute, thus presenting a significant improvement over known apparatus. In short, the present invention provides sorting, aligning, conveying and feeding of elongated parts such as electronic components with simple and economical operation, versatility, and reliability in use. Other objects and advantages of the present invention will become apparent as the description of the invention proceeds.

Briefly, in accordance with the present invention, there is provided an apparatus for aligning and sequentially feeding elongated objects or parts including a vibrating bowl for receiving the elongated objects, a means positioned within the bowl for removing bent objects and limiting the number of elongated objects conveyed up the bowl in side-by-side relationship, and means for feeding the elongated objects sequentially from the top of the bowl. The bowl has a base, a side wall, and a ramp spiralling along the inner perimeter of its side wall so that when the bowl is vibrated the elongated objects pass along the upper surface of the ramp from the bottom end of the ramp adjacent the base portion to the top end of the ramp.

According to the preferred embodiment of the present invention, the means for removing bent objects and limiting the number of elongated objects is a plurality of sorting stations defined by areas of smaller ramp widths. Inclines are provided in connection with the areas to permit the elongated objects to roll away from the ramp surface back to the next lower ramp level or all the way to the base of the bowl. A hopper and trough arrangement are provided near the bowl to feed a supply of elongated objects into the bowl at a controlled rate. Photoelectric means are also provided for sensing the quantity of elongated objects in the bowl and for controlling the rate at which the hopper supplies elongated objects to the bowl.

In order to disentangle clumps of elongated objects in bulk, the hopper includes a plurality of horizontal bars positioned across its bottom and at least one slanted bar angling upwardly from the horizontal bars to the front or leading wall of the hopper. Positioned adjacent the output end of the bowl, that is, at the uppermost end of the ramp, are a first slide and an adjacent curved second slide, together comprising the means for feeding the elongated objects sequentially. The first slide is inclined so as to direct each object approximately perpendicular to its axis and the curved slide is positioned to receive the elongated objects as they exit the first slide so that their downward motion continues but their lateral direction of motion is changed. Adjacent the output edge of the curved second slide is a rotating pick-up apparatus for removing the elongated objects sequentially from the second slide. This rotating pick-up apparatus is preferably a spur gear driven by a motor.

While the invention will be described in connection with preferred embodiments, it will be understood that it is not intended to limit the invention thereto, but rather to cover all modifications and alternative constructions falling within the spirit and scope of the invention as broadly defined. The invention will be further described in conjunction with the appended drawings.

BRIEF DESCRIPTION OF THE DRAWINGS

FIG. 1 is a side, perspective view of an apparatus for untangling, sorting, aligning and feeding elongated objects or parts such as electronic components with coaxial leads, with portions of the apparatus broken away for clarity;

FIG. 2 is a perspective view of a portion of the apparatus shown in FIG. 1, illustrating the hopper and trough assembly, the vibratory bowl with upwardly inclined ramp, and the rotating pick-up device adjacent the output end of the ramp;

FIG. 3 is a side view of the hopper taken along line 3—3 of FIG. 2 and illustrating the relationship of the horizontal and slanted bars, and their relative size in comparison with typical elongated parts;

DETAILED DESCRIPTION OF THE PREFERRED EMBODIMENT

Figure 4:
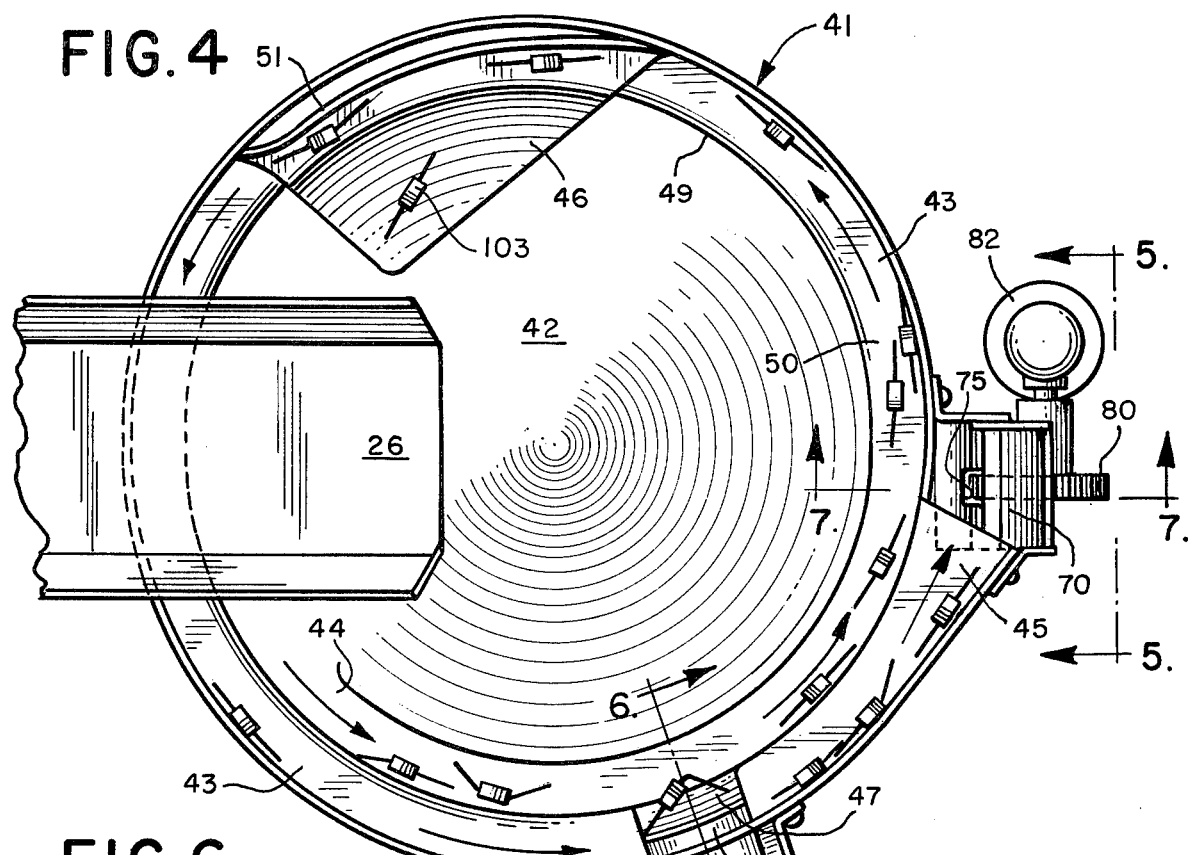
FIG. 4 is a top plan view of a portion of the apparatus shown in FIGS. 1 and 2, particularly illustrating the vibratory bowl with its first and second sorting stations, the trough for supplying elongated objects, and the rotating pick-up device.

Referring now to the drawings and more particularly to FIG. 1, there is illustrated an apparatus for untangling, sorting, aligning and feeding elongated parts, such as electronic components with coaxial leads, indicated generally by the reference numeral 10. This illustrated apparatus as herein described is particularly suited for untangling, sorting, aligning and feeding elongated electronic parts, such as resistors, capacitors or diodes.

The apparatus 10 includes an untangler 20, a vibratory bowl 40, a photoelectric sensor 60, an escape chute 70, a rotating pick-up device 80 and a conveyor belt 90. In operation, clumps of elongated parts 100, such as electronic components with coaxial leads, are dropped into the untangler 20 where they are disentangled and conveyed to the vibratory bowl 40. The photoelectric sensor 60 monitors the quantity of parts in the bowl 40, and controls the supplying of parts to the bowl 40, by energizing or de-energizing the untangler 20.

In the vibratory bowl 40, the parts 100 are sorted to remove parts with leads bent greater than about 60°. This angle for removal can be adjusted as discussed below depending on the extent to which it is desired to remove bent parts 110. The parts leave the feeder in single file and are directed through an escape chute 70 onto a rotary pick-up device in the form of a spur gear 80. The parts 100 are evenly spaced on the spur gear 80 and are sequentially fed from the gear 80 onto a conveyor belt 90, as shown in FIG. 1. The motion of the conveyor belt 90 is synchronized with the rotation of the spur gear 80.

Referring now to FIGS. 2 and 3, the operation of the untangler 20 is shown in detail. The untangler 20 includes a hopper 30 mounted on top of a trough 24. The hopper-trough assembly is secured to a reciprocating vibrating unit 28 for simultaneous vibration of the hopper 30 and the trough 24.

The parts 100 are dropped through the uppermost open portion 31 in the top of the hopper 30. Typically, the parts 100 are in clumps or other disarray. Slanted bars 32 interrupt the fall of the parts through the hopper 30. The slanted bars 32 are parallel to one another and all lie in the same plane. The slanted bars 32 are attached to the front or leading wall 36 of the hopper 30 at a point higher than where the slanted bars 32 are attached to the rear wall 38 of the hopper 30. Directly below the slanted bars 32 are horizontal bars 34. The horizontal bars 34 also are parallel to each other, and lie in a horizontal plane. The horizontal bars 34 are attached at the front wall 36 and rear wall 38 of the hopper 30 directly beneath the slanted bars 32. Although a plurality of slanted bars 32 are shown in this preferred embodiment, disentangling is possible according to the invention with only one slanted bar 32 positioned in the center of the hopper 30 between the two central horizontal bars 34.

The dimensions of the bars 32 and 34 and their spacing are determined, in part, by the dimensions of the parts 100 to be sorted, aligned, conveyed and sequentially fed by the apparatus 10. For instance, the parts 100 may be coaxial lead electronic components approximately two and one-half inches in overall length, having a cylindrical body 105 approximately one-fourth inch long and one-eighth inch in diameter, with coaxial leads 107 approximately 0.04 inch in diameter and each approximately one and one-eighth inch long. For a hopper approximately eight inches square, the bars 32 and 34 are preferably approximately one-half inch in diameter and are evenly positioned on one and one-half inch centers across the lower open portion of the hopper 30.

The reciprocating pulsing motion created by a reciprocating vibrating unit 28 on which the hopper-trough assembly is mounted throws the parts against the slanted bars 32 to disentangle the parts 100. The parts 100 also become approximately aligned with the horizontal bars 34 so that the parts 100 fall through the bars 34. The distance between the horizontal bars 34 and the bottom 27 of the trough 24 is greater than the overall length of a part 100 from the end of one lead 107 to the end of the other lead 107. Thus all of the parts 100 which fall through the bars 34 land in the trough 24, in a somewhat ordered fashion, minimizing the number of parts 100 aligned perpendicular to the bars 34, and thereby reducing the possibility of reclumping and jamming.

The reciprocating motion of the hopper 30 and the trough 24 forces the parts along the trough bottom 27 from the input end 25 beneath the hopper 30 to the output end 26 of the trough 24. The parts 100 fall over the trough output end 26 into the vibratory bowl 40. The photoelectric sensor 60 includes a light transmitter and receiver for sensing the quantity of elongated objects 100 in the bowl, and is coupled to the vibrating unit 28 to energize or de-energize the vibrating unit 28 and thereby control the rate at which the hopper 30 supplies elongated objects 100 to the bowl 41.

Referring now to FIG. 4, the trough output end 26 is positioned over the vibratory bowl 40 such that parts fall off the output end 26 and into the base 42 of the bowl 41. The bowl 41 has an internal ramp 43 and a convex base 42 at an angle from the center of about 3° from the horizontal. The ramp 43 begins at an input end 44 at the perimeter of the base 42, and is preferably inclined at an angle of about 7° from the horizontal away from the center of the bowl 41. The ramp 43 spirals upward counterclockwise, making almost one and a half turns. At the outer perimeter of the bowl base 42 is a vertical sidewall 49 which rises from the base 42 to the ramp surface 50, so that a cross section of the bowl 41 has a generally outwardly stepped configuration. After a full circle about the base 42 the sidewall 49 continues around the bowl 41 adjacent the outer edge of the ramp 43. The bowl 41 is mounted on a rotational vibrator 58 which provides the force for moving the parts 100 within the bowl 41. The vibrator 58 makes pulsed movements which combine short counterclockwise displacement with a short upward displacement, as is known in the art.

The untangled parts 100 in the base 42 of the bowl 41 are forced outward by centrifugal force from the short rotational movements created by the vibrator 58, and by the slight outward incline of about 7° on the upper surface 50 of the ramp 43. The parts 100 are forced against the sidewall 49 and move along the sidewall 49 in a counterclockwise direction. Thus, the parts 100 eventually reach the bottom or input end 44 of the ramp 43 to begin their ascent up the ramp 43.

For the total feeding operation to be most efficient, there should be enough parts 100 in the base 42 so that as the parts begin up the ramp 43 they are accompanied by other parts 100 in side-by-side relation. After the parts 100 move counterclockwise up the ramp 43 against the sidewall 49 for about half a revolution about the bowl 41, the parts encounter a first sorting station 120 provided by a first incline 46. The first incline 46 interrupts the ramp surface 50 leaving a surface 51 having a width in the preferred embodiment approximately double the width of a part 100. Other widths may be used depending upon the degree of sorting desired for this first incline 46. The incline 46 angles downwardly into the bowl base 42. Since according to the preferred embodiment no more than two parts 100 can pass side-by-side along the reduced ramp surface 51, excess parts 103 are forced off the ramp 43 into the base 42 of the bowl 41 along the incline 46. The leading edge 132 and discharge edge 134 of the incline 46 are preferably tapered downward toward the upper surface 50 of the ramp 43 to minimize interference of the incline 46 with smooth flow of the parts 100 up the ramp 43. Thus the incline 46 reduces the effective width of the ramp surface 51 and provides a slope for gently removing a part 100 from the ramp 43. Alternatively, the ramp surface 51 may be made smaller in width by physically removing a portion of it and providing an incline directly abutting the reduced width portion.

Figure 6:
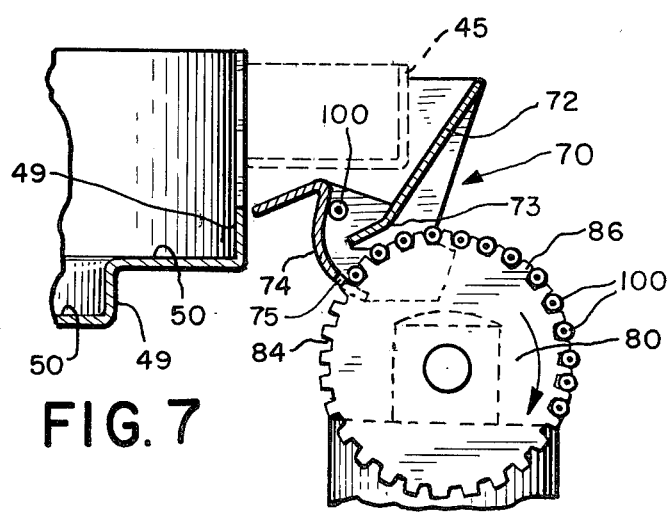
FIG. 6 is a cross-sectional view of the second sorting station of the apparatus of the present invention, taken along line 6—6 of FIG. 4, and illustrating the means for adjusting the width of the ramp and the incline positioned below the ramp.

Meanwhile, the remaining parts 100 continue past the first incline 46 and up the ramp 43. Opposite the bowl 41 from the first incline 46 is a second sorting station 130 provided by a second incline 47. The second incline 47 is illustrated in FIG. 6. This incline 47 cuts across the entire width of the ramp surface 50. The incline 47 extends along the ramp 43 for a distance slightly greater than the length of part 100 between the ends of its two leads 107. The second incline 47 does not continue downward to the base 42 of the bowl 41, but slants down into the sidewall 49 of a lower section of the ramp 43. Less than half of the original height of the sidewall 49 remains beneath the second incline 47.

An adjustable ledge 48 is provided adjacent and above the second incline 47 to extend into the bowl 41 and across the second incline 47. The ledge 48 rests upon a shelf 52 which is mounted onto the outside of the bowl 41 at the second incline 47. Two adjusting screws 54 secure the ledge 48 onto the shelf 52. Two grooves 56 in the ledge 48 accept the screws 54. The grooves 56 allow for variation in the distance that the ledge 48 extends into the bowl 41. The ledge 48 is preferably adjusted to extend into the bowl approximately the width of a part 100 being processed, and the ledge 48 lies flush with the ramp surface 50. Thus a single part 100 moving along the ramp 50 can pass by the second incline 47 on the ledge 48. However, more than a single part 100 cannot pass along the ledge 48 in side-by-side relationship.

A part 100 with a lead 107 which is bent greater than about 60° will not be able to maneuver past the second incline 47. A bent lead 107 will extend over the ledge 48 and if enough of the lead 107 extends from the ledge 48 at an angle greater than about 60°, the weight of the lead 107 and its angular momentum will cause the lead 107 to turn downwards, thereby toppling the part 100 down the second incline 47. Alternatively, the part 100 will be knocked off the ledge 48 when the bent lead 107 hits into the ramp edge 57 at the other side of the incline 47. The parts 100 with leads 107 bent less than about 60° will pass by the second incline 47 on the ledge 48. After the parts 100 pass the second incline 47 on the ledge 48, they will be in single file. The parts 100 continue along the ramp 43 until they reach the top or output end 45 and fall into the escape chute 70.

Figure 5:
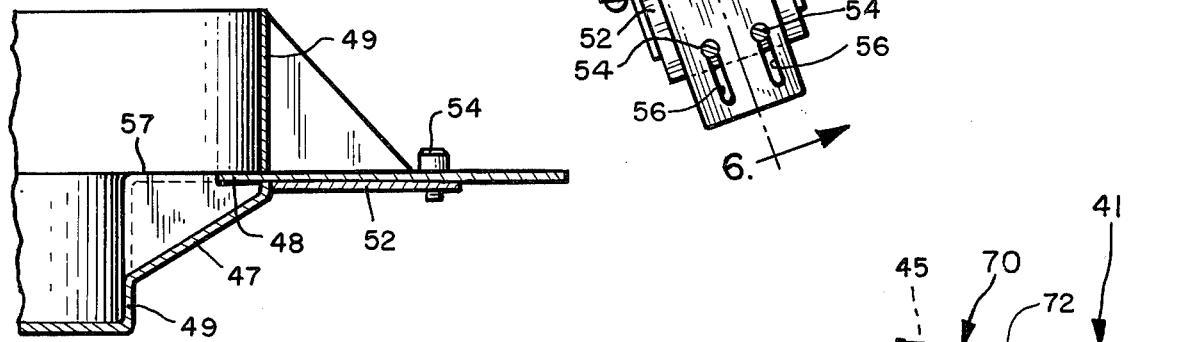
FIG. 5 is a side view of the escape chute and rotating pick-up device of the apparatus of the present invention taken along line 5—5 of FIG. 4.
Figure 7:
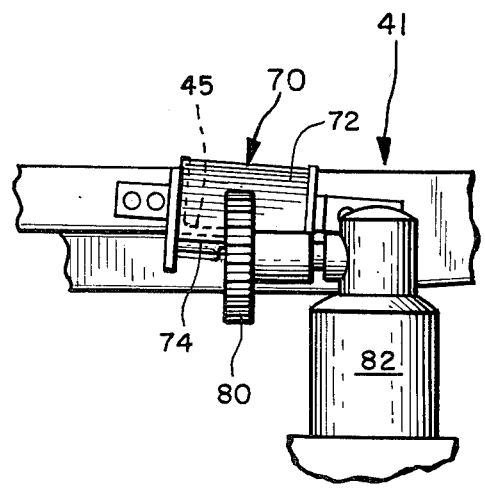
FIG. 7 is a cross-sectional view of the escape chute and rotating pick-up device of the apparatus of the present invention taken along line 7—7 of FIG. 4.

The escape chute 70 is illustrated in greater detail in FIGS. 5 and 7 and includes two slides. A first slide 72 provides a steep inclination for the parts 100 to fall down. The slide 72 is flat, except for a crease 73 across the slide 72 near its bottom. The slide 72 is bent upward at the crease 73 such that the slide 72 on either side of the crease 73 forms an obtuse angle at the crease. The first slide 72 is also cocked at a small angle from the horizontal as viewed in FIG. 5. The first slide 72 directs parts 100 downward and in the direction of the bowl center, perpendicular to the axis of each part 100.

Directly opposite the first slide 72 is a second slide 74. The second slide 74 is curved and is positioned so as to approximate an arc on a circle about the crease 73 in the first slide 72. The parts 100 roll off the first slide 72 and onto the second slide 74. The parts 100 continue their downward direction, but the second slide 74 redirects them outwardly away from the bowl 41. The second slide 74 also provides a staging area for the parts 100 to be picked up by the spur gear 80.

At the center of the bottom edge of the second slide 74 is a notch 75 large enough for the spur gear 80 to be partially received thereby. The spur gear 80 turns about a horizontal axis, and is rotated by a motor 32. The indentations 84 between the teeth 86 about the perimeter of the gear 80 are large enough to hold a single part 100 securely. Parts 100 roll down the second slide 74, and are stopped by the gear 80. The parts 100 rest on the slide 74 until the gear 80 turns so that a part 100 can roll into an indentation 84.

The body 105 of the part 100 is held by the gear indentation 84. The gear 80 carries the part around until it drops off onto a conveyor belt 90. The gear 80 and conveyor belt 90 are synchronized so that parts 100 falling off the gear 80 land in carrying receptacles 92 along the conveyor belt 90. The parts 100 are now aligned and have been sequentially fed and arranged for storage on tape strips in side-by-side lateral relation, feeding to an assembly machine, or other uses.

Although the apparatus of the present invention has been described with only one spiralling ramp, a bowl with multiple ramps could be used. Multiple ramps can be used to greatly increase the feed rate of the overall apparatus. In addition, they can provide the means for sorting and feeding different sized parts that are delivered in bulk to the apparatus.

Various other changes and modifications to the preferred embodiment described herein will be apparent to those skilled in the art. Such changes and modifications can be made without departing from the spirit and scope of the present invention and without diminishing its attendant advantages. It is, therefore, intended that all such changes and modifications be covered by the following claims.

I claim:

1. A system for sorting and sequentially feeding elongated objects with coaxial leads, wherein random leads within disordered clumps of the objects may be bent and entangled, comprising:
   hopper means for disentangling clumps of entangled elongated objects with coaxial leads;
   vibrating bowl means, including a base portion, a side wall, and a ramp spiralling along the inner perimeter of the side wall between the base portion and its output end, for receiving disentangled objects from the hopper means and conveying the objects along the upper surface of the ramp from the base portion to the output end;
   means positioned along the ramp for limiting the number of objects conveyed along the ramp in a side-by-side relationship;
   selection means positioned along the ramp for removing from the ramp surface objects with leads bent beyond a predetermined angular degree; and
   chute means curved and having an upper end mounted on the vibrating bowl means adjacent the output end of the ramp for receiving objects exiting the ramp and sequentially feeding them in downward direction to a lower end of the chute means while maintaining a lateral orientation.

2. The invention of claim 1 further comprising rotatable pick-up means positioned adjacent the lower end of the chute means for sequentially removing the objects from the lower end of the chute means.

3. The invention of claim 1 wherein the chute means includes a first curved slide means mounted on the bowl means adjacent the output end of the ramp for receiving objects exiting the ramp and for sequentially feeding them downwardly while maintaining a lateral orientation, and a second curved slide means mounted on the bowl means adjacent the first slide means for receiving objects exiting the first slide means, for feeding the objects in a downward direction while maintaining a lateral orientation but changing their lateral direction of motion, and for sequentially stacking the objects side-by-side at the bottom of the second slide means.

4. The invention of claim 1 wherein the hopper means includes a plurality of aligned bars fixed in a horizontal plane and at least one bar fixed in a plane slanted with respect to the horizontal plane and overlapping the aligned bars.

5. The invention of claim 4 further comprising means for reciprocally vibrating the hopper means to disentangle clumps of the objects with coaxial leads by vibrating them against the slanted bar and to align them as they pass through the horizontal bars.

6. The invention of claim 1 wherein the selection means includes means for reducing the number of objects conveyed along the ramp in a side-by-side relationship.

7. The invention of claim 6 wherein the selection means includes means for varying the width of the upper surface of the ramp so that the predetermined angular degree of the bent leads and the number of objects permitted to be conveyed along the ramp may be varied.

8. The invention of claim 1 further comprising means for sensing the quantity of objects in the bowl means and for controlling the rate at which the objects are received by the bowl means.

9. A system for sorting and sequentially feeding elongated parts with coaxial leads, wherein random leads within disordered clumps of the parts may be bent and entangled, ocmprising:
   hopper means, having a plurality of aligned bars fixed in a first plane of the hopper means and at least one bar fixed in a second plane of the hopper means, the second plane being slanted with respect to the first plane and the slanted bar overlapping the aligned bars, for disentangling clumps of entangled parts with coaxial leads and aligning the disentangled parts as they pass through the hopper means;
   vibrating bowl means, having a base portion, a side wall, and a ramp spiralling around the inner perimeter of the side wall between the base portion and its output end, for receiving aligned parts from the hopper means and conveying the parts along the upper surface of the ramp from the base portion to the output end;
   means positioned along the ramp for limiting the number of parts conveyed along the ramp in a side-by-side relationship;
   selection means positioned along the ramp for removing parts from the ramp surface with leads bent beyond a predetermined angular degree;
   first curved slide means having an upper end mounted on the vibrating bowl means adjacent the output end of the ramp for receiving parts exiting the ramp and sequentially feeding them in a downward direction while maintaining a lateral orientation;
   second curved slide means mounted on the vibrating bowl means adjacent the first slide means for receiving parts exiting the first slide means, for guiding the parts downwardly while maintaining a lateral orientation but changing their lateral direction of motion, and for sequentially stacking the parts side-by-side at the bottom of the second slide means; and
   rotatable pick-up means positioned adjacent the bottom of the second slide means for sequentially removing the stacked parts from the second slide means.

10. The invention of claim 9 wherein the hopper means includes a plurality of aligned bars fixed in a horizontal plane of the hopper means and at least one bar fixed in a plane that is slanted with respect to the horizontal plane, the slanted bar positioned above and overlapping the horizontal bars.

11. The invention of claim 10 further comprising means for reciprocally vibrating the hopper means to disentangle clumps of the parts with coaxial leads by vibrating them against the slanted bar and aligning them as they fall through the horizontal bars.

12. The invention of claim 9 wherein the limiting means includes an incline interrupting a section of the upper ramp surface and projecting downwardly towards the base portion of the bowl means.

13. The invention of claim 9 wherein the selection means includes means for varying the width of a predetermined length of the upper surface of the ramp so that the predetermined angular degree of the bent leads may be varied.

14. The invention of claim 9 wherein the second slide means includes a notch in its bottom for receiving the pick-up means so that the stacked parts are removed by the pick-up means before they reach the end of the second slide means.

15. The invention of claim 9 further comprising means for sensing the number of parts in the bowl means and for controlling the rate at which parts are received by the bowl means.

16. A system for sorting and sequentially feeding electronic components with coaxial wire leads, wherein random leads within disordered clumps of the components may be bent and tangled, comprising:
  a hopper having an uppermost portion for receiving disordered clumps of components wherein random leads may be bent and tangled and a lowermost portion having a plurality of horizontal bars extending thereacross and at least one slanted bar extending above and overlapping the horizontal bars;
  a trough having a base plate positioned below the horizontal bars at a distance approximately the length of the components so that the components fall onto the base plate lengthwise without interference from the horizontal bars;
  means for reciprocating the hopper and trough to disentangle the components by vibrating them against the slanted bar, to align the components as they fall between the horizontal bars, and to advance the aligned components along the base plate of the trough;
  a bowl having a base portion, a side wall, and a ramp spiralling around the inner perimeter of the side wall between the base portion and its output end, positioned to receive parts in the base portion from the trough, and vibrated to convey the components along the upper surface of the ramp from the base portion to the output end;
  an incline interrupting a section of the upper ramp surface and projecting downwardly towards the base portion of the bowl for limiting the number of parts conveyed along the ramp in a side-by-side relationship;
  means for varying the width of a predetermined length of the upper ramp surface to reject from the ramp surface components with leads bent beyond a predetermined angular degree and to further limit the number of parts that may be conveyed along the ramp in a side-by-side relationship;
  a first curved slide having an upper end mounted on the vibrating bowl to receive components exiting the output end of the ramp and to sequentially feed them in a downward direction while maintaining a lateral orientation;
  a curved second slide mounted on the vibrating bowl adjacent the first slide to receive components exiting the first slide, to feed them so that their downward motion and lateral orientation continues but their lateral direction of motion is changed, and to sequentially stack the components side-by-side at the bottom of the second slide; and
  a rotatable wheel with means along its periphery for sequentially picking up stacked components from the bottom of the second slide even if the leads are bent.

17. The invention of claim 16 wherein the second slide includes a notch in its bottom for receiving the pick-up wheel so that the stacked components are removed by the pick-up wheel before they reach the end of the second slide.

18. The invention of claim 17 wherein the varying means includes an adjustable plate.

19. The invention of claim 18 further including means for photoelectrically sensing the quantity of components in the bowl and for controlling the rate at which the components advance along the trough.

* * * * *

UNITED STATES PATENT AND TRADEMARK OFFICE
CERTIFICATE OF CORRECTION

PATENT NO. : 4,462,508

DATED : July 31, 1984

INVENTOR(S) : Gerald R. Grafius

It is certified that error appears in the above-identified patent and that said Letters Patent is hereby corrected as shown below:

<u>IN THE CLAIMS</u>

In claim 9 (column 8, line 31), please delete "ocmprising" and substitute therefore --comprising--.

Signed and Sealed this

Twenty-second Day of December, 1987

Attest:

DONALD J. QUIGG

*Attesting Officer*       *Commissioner of Patents and Trademarks*